United States Patent [19]

Deitch et al.

[11] 4,037,913

[45] July 26, 1977

[54] PRINTED CIRCUIT JACK

[75] Inventors: James C. Deitch, Bloomington; Lawrence F. Leistiko, Minneapolis, both of Minn.

[73] Assignee: Magnetic Controls Company, Minneapolis, Minn.

[21] Appl. No.: 691,891

[22] Filed: June 1, 1976

Related U.S. Application Data

[63] Continuation-in-part of Ser. No. 549,731, Feb. 13, 1975, abandoned.

[51] Int. Cl.[2] ........................ H01R 13/50; H05K 1/04

[52] U.S. Cl. ........................ 339/221 M; 339/182 R

[58] Field of Search ............... 339/17 R, 17 C, 217 R, 339/217 S, 221 R, 221 L, 221 M, 149 P, 150 B, 182 R, 182 RS, 183

[56] References Cited

U.S. PATENT DOCUMENTS

| | | | |
|---|---|---|---|
| 3,148,010 | 9/1964 | Woodward | 339/182 R |
| 3,289,149 | 11/1966 | Pawloski | 339/183 |
| 3,514,737 | 5/1970 | Renshaw, Jr. | 339/17 C |

*Primary Examiner*—Roy Lake
*Assistant Examiner*—Neil Abrams
*Attorney, Agent, or Firm*—Neil B. Schulte

[57] ABSTRACT

A miniature telephone jack with a molded housing especially adapted for use on printed circuit boards in which spring metal contacts grasp an inserted plug at the proper locations along its length with balanced, firm forces even though the contacts are all inserted from one side of the housing and have lugs extending therefrom through holes in the other side of the housing to make contact directly with a circuit board. The spring metal contacts include specially designed barbs which fit in slots molded on the sides of the housing to lock them in place.

9 Claims, 15 Drawing Figures

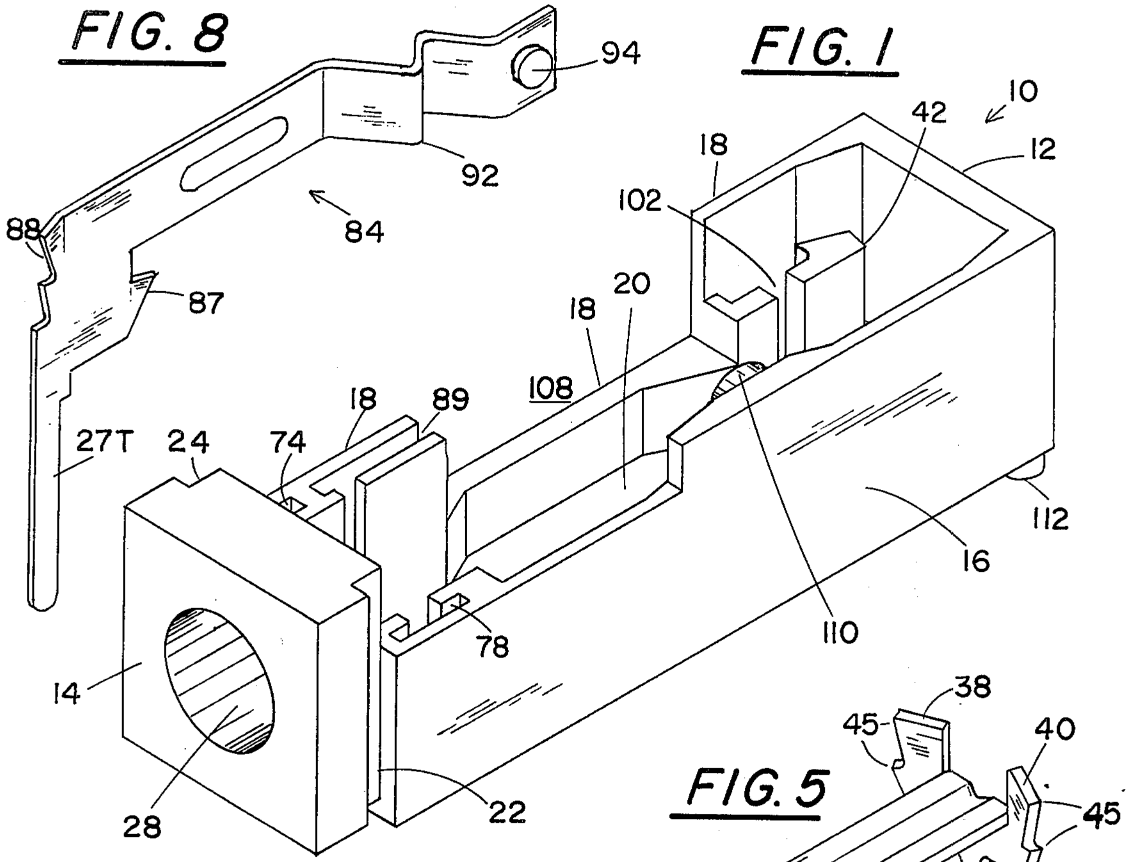
FIG. 8
FIG. 1
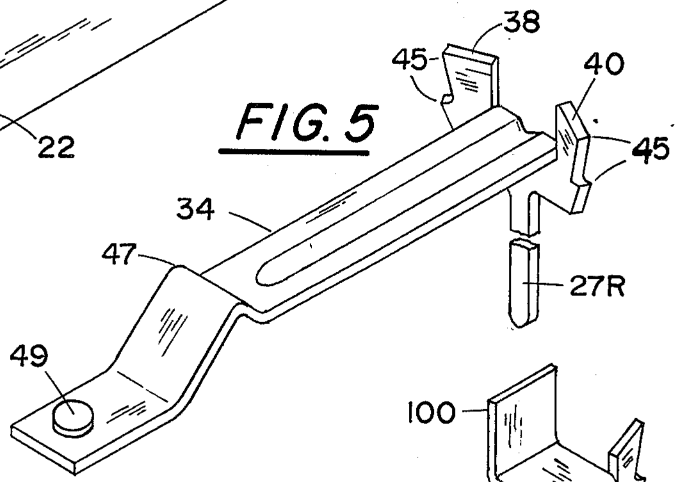
FIG. 5
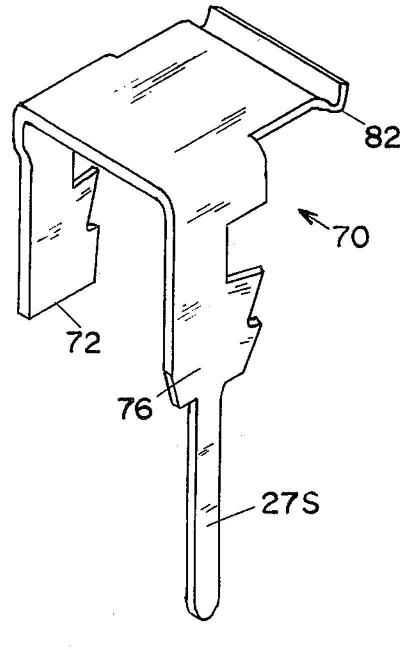
FIG. 9
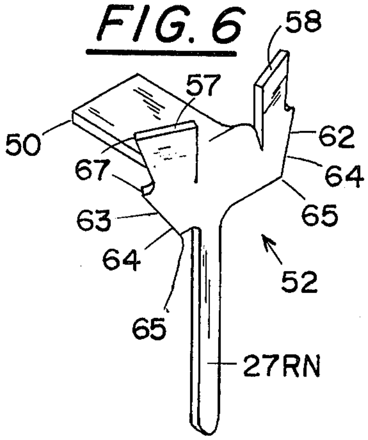
FIG. 6
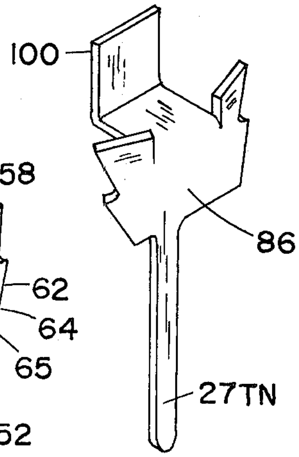
FIG. 7

FIG. 11
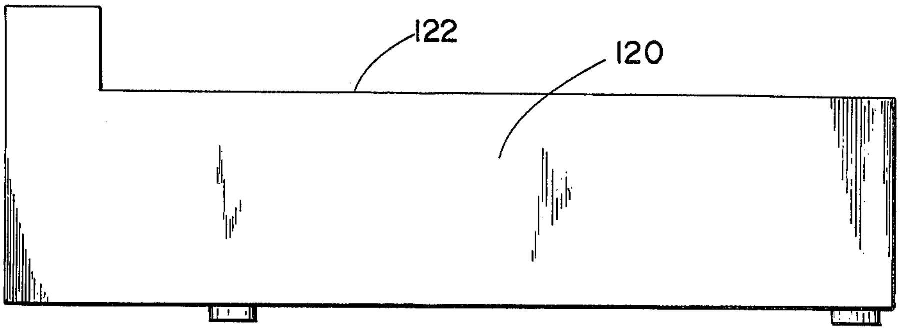
FIG. 12
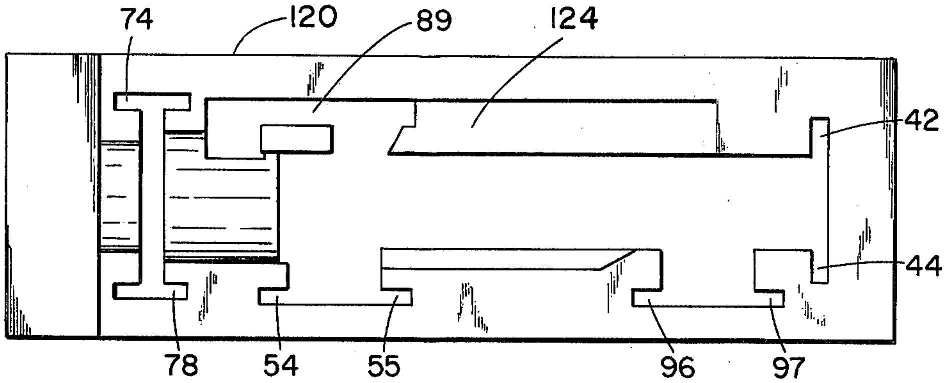
FIG. 13
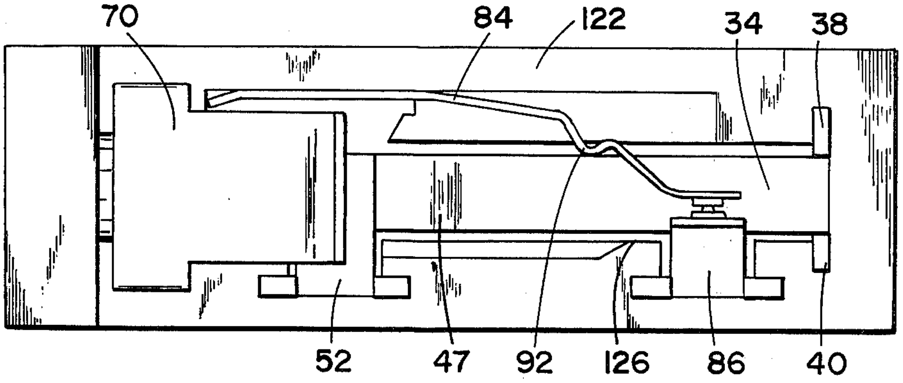
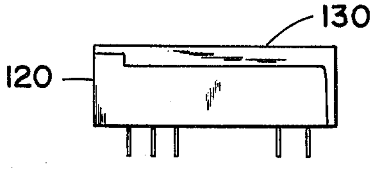
FIG. 14
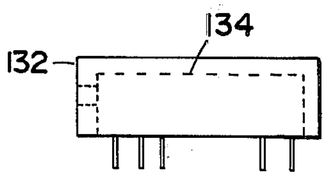
FIG. 15

PRINTED CIRCUIT JACK

CROSS-REFERENCE TO RELATED APPLICATION

This application is a continuation-in-part of our co-pending patent application Ser. No. 549,731, filed Feb. 13, 1975 and titled Printed Circuit Jack, now abandoned.

BACKGROUND OF THE INVENTION

In the prior art, jacks have generally comprised a lamination of a number of spring metal contacts separated by insulators and mounted on one end of a metal frame. The other end of the frame forms the entrance end and accepts a plug. The entrance end is then adapted to be mounted in a panel, the most common example of which can be found in the telephone industry. As the art has been refined, telephone jacks have been produced in smaller configurations, commonly called miniature jacks in the industry, which are mounted in quite close proximity on jack panels. With the introduction of printed circuitry it has been found most convenient to make the printed circuit board slide in and out of the jack panel from the access side or jack entrance side. Accordingly, one may find a number of circuit boards positioned immediately alongside and between rows of jacks in close proximity thereto. Since conventional jacks have contacts extending from the rear of the jack the wiring between the jacks and the circuit boards is accomplished by groups of small wires which must be soldered to the back of the jacks and then routed to connection points on the circuit boards. In order to make such connections it is obvious that a burdensome amount of labor is involved and that a lot of space must be provided for the wiring. The present invention avoids these problems by providing a miniature telephone jack wherein the electrical spring metal contacts themselves extend out not the rear, but rather the bottom of a molded housing to connect directly with the adjacent printed circuit board. However, because of the severe space limitations associated with miniature jacks, it is very difficult to design spring contacts which will grasp the inserted plug at the proper industry standardized locations along its length with sufficient force to firmly hold the plug and still fit in the available space. The present invention solves this problem with cleverly designed spring contacts which grasp the plug from different sides providing firm and balanced forces as described hereinafter.

SUMMARY OF THE INVENTION

Briefly, our invention contemplates a jack formed from a molded plastic housing which mounts directly to the adjacent circuit board. Small metal contacts or springs in the jack make firm circumferentially balanced contact with a plug inserted thereinto. These springs have lugs extending therefrom through holes in the jack housing directly into the appropriate circuit connection holes in the circuit boards. Thus, there is no need for separate wiring between the board and the jack.

The design of the jack is such that all of the springs can be inserted from one side of the jack, which side is opposite from the circuit board. Thus, the contacts are entirely inside an insulated housing where they are completely protected from short circuits and dirt. This is no small accomplishment in the size range of a miniature telephone jack where each jack must fit in a space only 1.2 inches long and 0.364 inches wide. In one embodiment the top surface of the jack is flat so the spring contacts can be pushed in together with a flat tool to a flush position thus simplifying the assembly procedure and insuring proper positioning.

The springs are held in place in the housing by slots formed on the side walls which accept barbed tabs formed on the springs in a locking relationship which holds the springs in the proper position to contact the plug. Each spring is uniquely designed to accomplish several design objectives including being mountable in slots in the side walls to permit a sliding entry from the top, contacting the plug at a standardized location, supplying sufficient spring force to retain the plug, being mountable in a very limited space, and being located on different sides of the plug so as to balance the forces thereon to avoid pushing the plug off center which would prevent proper electrical contact. Also the jack incorporates two normal through circuits and does not have to be manually adjusted after assembly to align the springs with the plug entrance hole.

It may therefore be seen that it is an object of our invention to provide an improved jack which can be mounted directly to a circuit board, which is easier and less expensive to assemble, and which holds the plug firmly with balanced forces. Further objects and advantages will become apparent from the following detailed description and drawings.

BRIEF DESCRIPTION OF THE DRAWINGS

FIG. 1 is a perspective view of the housing of our jack.

FIGS. 5, 6, 7, 8 and 9 are perspective views of the various spring members which fit into the housing shown in FIG. 1 to form both the plug contacts and the circuit board connections.

FIG. 11 is an elevational side view of another embodiment of the invention.

FIG. 12 is a top view of the embodiment of FIG. 11.

FIG. 13 shows the spring contacts mounted in the housing of FIG. 12.

FIG. 14 shows a cover for the housing.

FIG. 15 shows a third embodiment for the invention.

DESCRIPTION OF THE PREFERRED EMBODIMENTS

Figure 2:
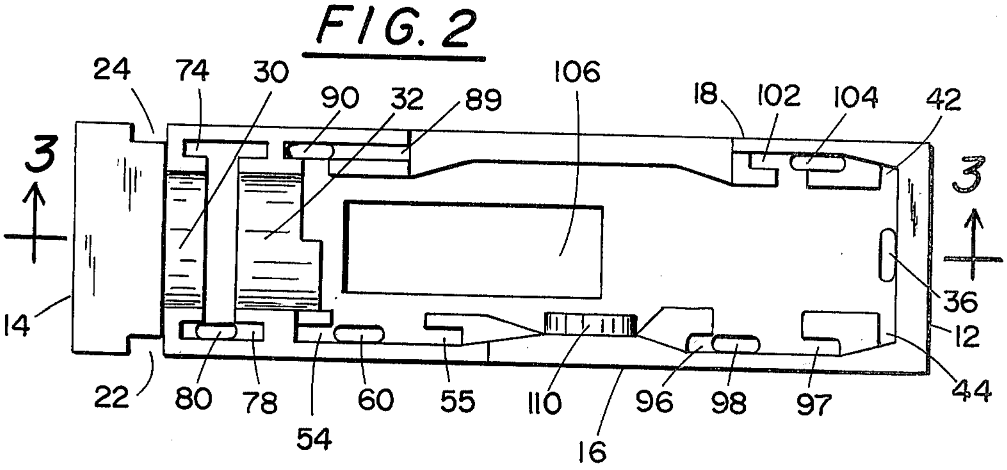
FIG. 2 is a top view of the jack of FIG. 1.
Figure 3:
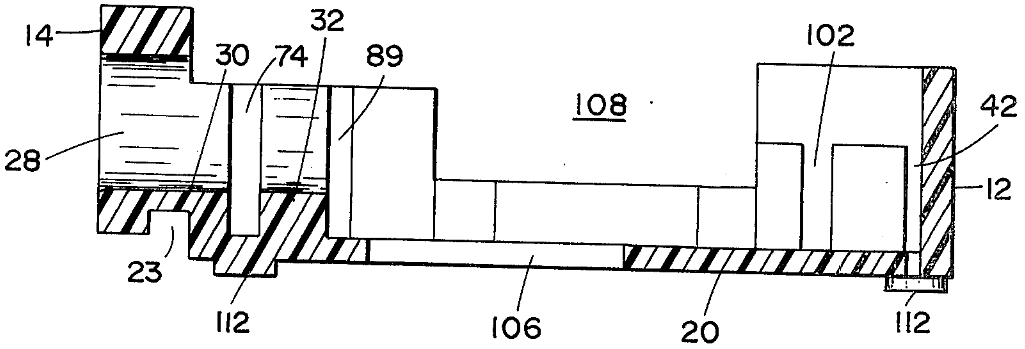
FIG. 3 is a sectional view taken on line 3—3 in FIG. 2.
Figure 4:
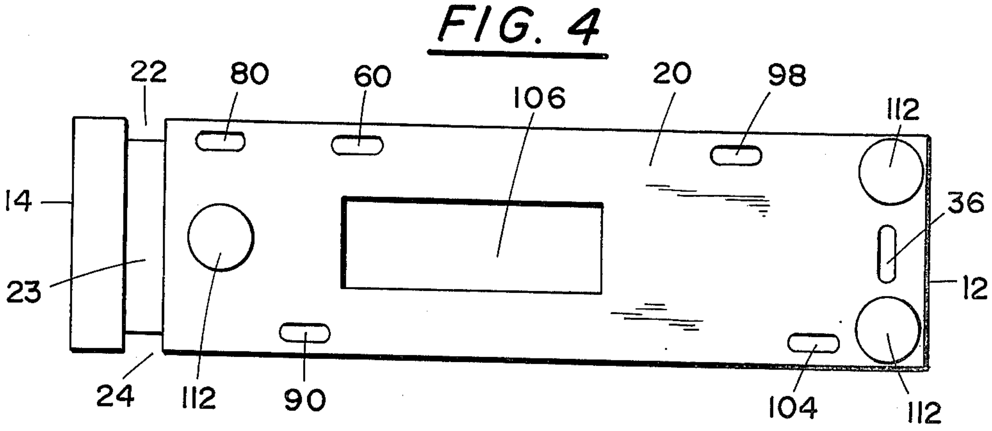
FIG. 4 is a bottom view of the jack housing.

Referring simultaneously to FIGS. 1, 2, 3, and 4 the jack housing 10 of the present invention is shown comprising two smaller end surfaces 12 and 14 connected together by longer side walls 16 and 18 and third side or bottom wall 20. The entrance end 14 is provided with slots 22 and 24 on the sides and a slot 23 on the bottom to facilitate mounting the jack in the front panel 25 as shown in FIG. 10.

Figure 10:
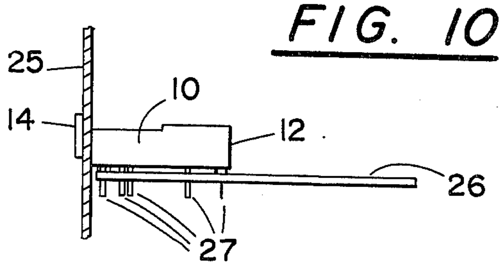
FIG. 10 is a diagramatic view of the jack housing, actual size, showing how the jack mounts in a front panel and also directly to the circuit board.

In FIG. 10 the jack of the present invention is shown actual size mounted on a circuit board 26 with the circuit board contacting lugs 27 shown mounted through circuit board 26. As can be seen in FIG. 10 the entrance end 14 is mounted by means of slots 22, 23 and 24 in the front panel 25. If desired, slots 22, 23, and 24 can be eliminated as in the embodiment of FIGS. 11, 12, and 13.

Returning again to FIGS. 1 through 4 it may be seen that the plug is inserted into jack 10 through a hole 28 in the entrance end 14. As the plug passes through hole 28 it continues along the elongate axis of the housing over a pair of curved troughs 30 and 32. Once inside the housing the plug makes contact with a number of springs held in the housing in slots. The position of each of these springs is described hereinafter, wherein each of the springs is described according to the circuit function it normally performs in a telephone jack and plug circuit.

In FIG. 5 the ring spring 34 is shown which lies in the housing as shown in FIG. 1 generally in the position shown in FIG. 5. Ring spring 34 lies along the inside of bottom wall 20 with the circuit board contacting lug 27R extending down through a hole 36. A pair of locking tabs 38 and 40 slide respectively into a pair of slots 42 and 44. When fully inserted a set of barbs 45 formed on tabs 38 and 40 anchor the ring spring in place. It should be noted that an important part of the design herein is involved in the slight bending of tabs 38 and 40 so that as the ring spring 34 is forced down into slots 42 and 44 the ring spring is moved solidly against end surface 12 to provide accurate positional location. Reference to FIGS. 6 through 9 will demonstrate that all of the spring metal contacts have barbs which are bent slightly inward to achieve this tightening action. As the plug is inserted into the jack housing it makes contact with the hump 47 on ring spring 34 moving the spring downward so that a contact 49 breaks circuit with another contact on the bottom of a tab 50 on the ring normal spring 52 shown in FIG. 6.

The ring normal spring shown in FIG. 6 mounts into a pair of slots 54 and 55 and is locked therein with tabs 57 and 58 respectively. The printed circuit board connecting lug 27RN extends through the hole 60 in the bottom wall 20. Ring normal spring 52 also has tabs 57 and 58 bent slightly forward as described with respect to the tabs on the ring spring in FIG. 5. It should also be noticed in FIG. 6 that the lower barbs have a surface edge 62 and 63 which is cut in at a steeper angle so that as the contact is pushed into the slot in the housing the top edges of the slots will initially contact the spring at the points indicated by the number 64 rather than the abrupt edges indicated by the numbers 65. This steep angle on the edges 63 and 62 combined with the forward bend, thus insure a smooth entry into the slot and a prompt tightening of the corners of the barbs 67 against the wall of the slot. Reference to FIGS. 5 through 9 will show that all of the barbs used on all of the springs employ this slight inward bend combined with a steep angle on the lower barb to insure an initial sliding contact with the entrance ends of the slots in the housing.

The ground contact may be made by the sleeve spring 70 shown in FIG. 9 which mounts on the opposite side of the plug from the ring spring 34. This position permits a balancing of spring forces on both sides of the plug to avoid having the plug pushed off center. Hole 28 is made short and will not, by itself, hold the plug along the elongate axis against the spring force exerted by spring 70. Spring forces should be kept high to insure good electrical contact and firm retention of the plug. By mounting spring 34 on the opposite side the forces are balanced and the plug remains in the proper position to contact the other spring members which are or may be mounted along side it. This balancing of springs is also advantageous in that the jack will serve longer maintaining a good contact even after extensive wear of the plug entrance hole. Sleeve spring 70 has a connecting tab 72, again with slightly bent barbs, that slides into a slot 74 in side wall 18 and another tab 76 which extends into a slot 78 in side wall 16. The printed circuit contacting lug 27S extending from the bottom of tab 76 passes through a hole 80. The top of sleeve spring 70 is curved downward to form a hump 82 to contact the plug.

In telephone circuits as well as other types of circuits the plugs often have a third circuit. Contacts for this circuit are provided by a tip spring 84 shown in FIG. 8 and a tip normal spring 86 shown in FIG. 7. The slightly bent mounting tabs 87 and 88 on tip spring 84 slide into a slot 89 on wall 18 with a lug 27T extending downward through a hole 90. Insertion of the plug will cause contact with the hump 92 forcing tip spring 84 backwards slightly so that a contact 94 breaks a circuit with the tip normal spring 86 shown in FIG. 7.

Tip normal spring 86 is mounted above the ring spring 34 in the slots 96 and 97 on elongated side wall 16. The connecting lug 27TN at the bottom of tip normal spring 86 extends through a hole 98. Contact 94 on tip spring 84 nomally rests against tab 100 on tip normal spring 86.

An additional set of slots 102 and a hole 104 are provided in the housing 10 for additional springs which may be added if desired.

In order to provide room for the ring spring 34 to move downward upon the insertion of a plug, a clearance hole 106 may be provided in bottom wall 20. Likewise a clearance window 108 may be provided in side wall 18 to allow tip spring 84 to bend sideways. However, these clearance spaces are not used in the embodiment shown in FIGS. 11, 12, and 13 where a somewhat larger housing is employed. A small riser 110 is formed on the inside of wall 16 against which the plug may rest under the sideways force exerted by tip spring 84. A series of three small risers 112 are formed on the bottom wall 20 on the outside to help space the jack housing 10 approximately 20/1000 of an inch from the circuit board 26 to permit easier soldering.

It may be seen that all of the mounting slots extend generally orthogonal to the elongate axis of the housing along which the plug lies. Thus, all of the slots open at the top of the housing at the side opposite from the printed circuit board. This has several advantages. The housing surrounds the contact elements on five of the six sides to provide complete segregation from the circuit board which avoids shorts and physical damage. If the slots ran in different directions the housing would have to be opened on more than one side to accept the contacts. But even with the slots all orthogonal to the elongate axis the design still permits the contacts to surround the plug and provide firm balanced spring forces. Another advantage of having all the slots open to one side is that all of the spring elements may be inserted from one side of the housing while still retaining a relatively simple mold. Inserting the contact elements from one side is advantageous in that all of the elements may be simultaneously pressed into place with a flat tool and uniformly positioned if the top edges of the case are caused to form a flat plane as is the case with the embodiment shown in FIGS. 11, 12, and 13.

In FIG. 11 another embodiment is shown wherein the housing 120 is designed to have a flat top surface 122 so that all of the spring contact elements except the sleeve spring may be pushed into the housing simultaneously with a suitable flat tool. The various spring contacts are sized so that they are properly positioned when pushed to a position flush with the flat top surface 122. Reference to FIG. 12 will show that the arrangement of slots in the housing is similar to that of the first embodiment except that most of the surfaces are brought up to a position flush with top surface 122. One exception is the plateau area 124 over which the tip spring 84 extends.

FIG. 13 shows a top view of the second embodiment with the springs inserted. Spring contact elements 84, 34, 86, and 52 may be all simultaneously pressed into place with a flat tool to a position flush with top surface 122 thus simplifying the assembly procedure and ensuring uniform positioning of the spring contact elements. It should be noticed that as the plug is inserted from the left in FIG. 13 it travels under the sleeve spring 70 making contact therewith, over spring 34 contacting hump 47 and alongside spring 84 contacting hump 92. The sideways spring force from spring contact 84 is relieved by a housing surface 126. With the arrangement shown in FIG. 13 springs 34 and 84 rest against the normal through springs 52 and 86 respectively at points beyond humps 47 and 92 respectively at locations which are a maximum distance from the pivoting point of springs 34 and 84. Thus, a maximum travel distance is created at the points where the springs contact the normal through contacts which guarantees a more reliable switching action when the plug is inserted and withdrawn. Also, this design determines the position of the contacting humps 47 and 92 so that manual adjustment after assembly, which is always necessary in the prior art, is not needed. It should be appreciated that these advantages are achieved while still retaining a design wherein the spring elements can all be inserted from one side of the housing. It should also be appreciated that the positioning of the springs permits the lugs to emerge from the bottom of the housing in well spaced locations so that when they are soldered to the printed circuit board below the chance of solder flowing from one to another and causing a short circuit is reduced. The spacing of the lugs and their positioning is therefore also important to the design and still a further example of the advantages obtained while still retaining a housing that encloses the spring elements giving them maximum protection and allowing the jack to be assembled with all of the spring contacts inserted from a single side.

In FIG. 14 the housing 120 is shown with a possible plastic cover 130 mounted thereon. Cover 130 may be held in place by any suitable means such as plastic risers or slots. However, the cover is not required for proper operation.

In FIG. 15 yet another embodiment is shown in which the housing is molded with an integral top surface and open at the bottom. All of the slot design and configuration would be exactly the same as that shown in FIGS. 12, and 13 except that they would open from the bottom and terminate at the top. The housing 132 would have a hollow cavity generally shown by dashed line 134. Although it would be unnecessary in this embodiment to provide a plastic cover 130 there would be a disadvantage in that most of the spring elements would be exposed on the bottom in a position proximate the circuit board which could produce the hazard of short circuits.

It is evident to those skilled in the art that it would be possible to form the various slots shown with different configurations which would still permit the spring elements to be mounted in the housing. We therefore do not intend to be limited to the specific arrangement of slots or structure shown in the drawings except as defined by the following claims.

We claim:

1. A molded jack especially suitable for direct connection on its bottom side to a printed circuit board comprising an elongated molded nonconducting housing having an elongate axis and first and second generally parallel end surfaces generally perpendicular to the elongate axis at opposite ends of the housing, said surfaces connected together by elongated first and second generally parallel side walls extending therebetween, parallel to the elongate axis, said end surfaces also connected together by a third elongated side wall intermediate said first and second side walls, and said housing having an entrance hole in said first end surface to accept a plug along the elongate axis therethrough into the space between the side walls, and the end surfaces, with a plurality of spring metal contacts mounted in said housing by means of a plurality of vertical slots, said slots formed in the first and second side walls generally orthogonal to the elongate axis of said housing, said slots open at their ends remote from said third side wall so as to accept the spring contacts therein, said contacts having lugs extending therefrom which extend through the bottom of the housing to make contact with the circuit board, and said spring contacts including at least one pair of balanced spring contacts comprising a first spring contact extending from said first side wall to said second side wall proximate the first end surface and mounted in a vertical slot in the first side wall and a vertical slot in the second side wall so as to press against a plug inserted into the housing, and a second spring contact extending along the third side wall parallel to the elongate axis and mounted proximate the second end surface in vertical slots in the first and second side walls so as to press against the other side of the plug inserted into the housing to balance the force of said first spring contact and including a third spring contact mounted along said first side wall and in vertical slots in said first side wall so as to press against the side of a plug inserted into the housing.

2. The jack of claim 1 in which said third side is on the bottom and said vertical slots are substantially closed at their bottom ends, except for holes which pass said lugs, so as to segregate said spring contacts from the circuit board.

3. The jack of claim 2 in which said housing includes a riser molded therein on the opposite side of the plug from said third spring so as to resist the force from said third spring.

4. The jack of claim 3 in which said second and third spring contacts extend beyond their points of contact with an inserted plug to contact normal through spring contacts when no plug is inserted in the housing, said normal through contacts mounted in vertical slots in said second side wall.

5. The jack of claim 4 in which the said remote open ends of the slots for the spring contacts are at the tops of the side walls, which side wall tops are molded in a flat plane to allow many of the spring contacts to be pushed into the vertical slots flush with the side wall tops to insure uniform positioning.

6. The jack of claim 4 in which the spring contacts are formed with barbs on the portions that fit into the slots so as to lock said spring contacts therein, said barbs being shaped and angled steeply to grasp the slots but still enter the slots easily.

7. The jack of claim 4 in which said lugs extending from the spring metal contacts comprise a first lug connected to said first contact and extending through the bottom of the housing proximate the first end surface, a second lug connected to said third contact and extending through the bottom of the housing at a location more removed from the first end surface than the first lug and on the other side of the housing from said first lug, a third lug connected to a normal through contact and extending through the bottom of the housing at a location even more removed from the first end surface than the second lug and on the same side as the first lug, a fourth lug connected to another normal through contact and extending through the bottom of the housing at a location more removed from the first end surface than the third lug and on the other side from said second lug, and a fifth lug connected to the second contact and extending through the bottom of the housing at a location proximate the second end surface.

8. The jack of claim 1 in which said third side is on the top and said vertical slots are substantially closed at their top ends.

9. The jack of claim 8 in which the said open remote ends of the slots for the spring contacts are at the bottoms of the side walls, which side side wall bottoms are molded in a flat plane to allow many of the spring contacts to be pushed into the vertical slots flush with the side wall bottoms to insure uniform positioning.

* * * * *